(12) United States Patent
Ward

(10) Patent No.: US 7,368,727 B2
(45) Date of Patent: May 6, 2008

(54) ATOMIC LEVEL ION SOURCE AND METHOD OF MANUFACTURE AND OPERATION

(75) Inventor: Billy W. Ward, Merrimac, MA (US)

(73) Assignee: ALIS Technology Corporation, Peabody, MA (US)

( * ) Notice: Subject to any disclaimer, the term of this patent is extended or adjusted under 35 U.S.C. 154(b) by 15 days.

(21) Appl. No.: 10/966,243

(22) Filed: Oct. 15, 2004

(65) Prior Publication Data

US 2007/0051900 A1   Mar. 8, 2007

Related U.S. Application Data

(60) Provisional application No. 60/511,726, filed on Oct. 16, 2003.

(51) Int. Cl.
*H01J 37/08* (2006.01)
(52) U.S. Cl. ............. 250/423 R; 250/309; 313/362.41; 313/230
(58) Field of Classification Search ............. 250/423 R
See application file for complete search history.

(56) References Cited

U.S. PATENT DOCUMENTS

| | | |
|---|---|---|
| 3,602,710 A | 8/1971 | Mueller |
| 3,868,507 A | 2/1975 | Panitz |
| 4,044,255 A | 8/1977 | Krisch et al. |
| 4,139,773 A | 2/1979 | Swanson |
| 4,236,073 A | 11/1980 | Martin |
| 4,352,985 A | 10/1982 | Martin |
| 4,451,737 A | 5/1984 | Iszkozawa |
| 4,467,240 A * | 8/1984 | Futamoto et al. ............ 313/336 |
| 4,639,301 A | 1/1987 | Doherty et al. |
| 4,721,878 A * | 1/1988 | Hagiwara et al. ........ 313/362.1 |
| 4,874,947 A | 10/1989 | Ward et al. |
| 4,954,711 A * | 9/1990 | Fink et al. ............... 250/423 R |

(Continued)

FOREIGN PATENT DOCUMENTS

EP    0 317 952    5/1989

(Continued)

OTHER PUBLICATIONS

"Chemically and geometrically enhanced focused ion beam micromachining," Journal of Vaccum Science and Technology B, vol. 16., No. 4, Jul./Aug. 1998, 2494-2498.

(Continued)

*Primary Examiner*—Nikita Wells
*Assistant Examiner*—James J. Leybourne
(74) *Attorney, Agent, or Firm*—Fish & Richardson, P.C.

(57) ABSTRACT

Ion source and method of making and sharpening. The ion source is a single crystal metal conductor having a substantially conical tip portion with substantial rotational symmetry. The tip portion terminates with a tip radius of curvature in the range of 50–100 nanometers. The ion source is made by electrochemical etching so that a conical tip of a selected geometry is formed. The ion source is then sharpened to provide a source of ions from a volume near the size of a single atom. Further, this ion source makes possible a stable and practical light ion microscope which will have higher resolution than existing scanning electron microscopes and scanning metal-ion microscopes.

25 Claims, 5 Drawing Sheets

U.S. PATENT DOCUMENTS

| | | | |
|---|---|---|---|
| 4,983,540 | A | 1/1991 | Yamaguchi et al. |
| 4,985,634 | A | 1/1991 | Stengl et al. |
| 5,034,612 | A | 7/1991 | Ward et al. |
| 5,151,594 | A | 9/1992 | McClelland |
| 5,188,705 | A | 2/1993 | Swanson et al. |
| 5,414,261 | A | 5/1995 | Ellisman et al. |
| 5,574,280 | A | 11/1996 | Fujii et al. |
| 5,750,990 | A | 5/1998 | Mizuno et al. |
| 5,783,830 | A | 7/1998 | Hirose et al. |
| 5,976,390 | A | 11/1999 | Muramatsu |
| 6,028,953 | A | 2/2000 | Nakamura et al. |
| 6,042,738 | A | 3/2000 | Casey, Jr. et al. |
| 6,211,527 | B1 | 4/2001 | Chandler |
| 6,268,608 | B1 | 7/2001 | Chandler |
| 6,354,438 | B1 | 3/2002 | Lee et al. |
| 6,395,347 | B1 | 5/2002 | Adachi et al. |
| 6,414,307 | B1 | 7/2002 | Gerlach et al. |
| 6,504,151 | B1 | 1/2003 | Mitchell et al. |
| 6,538,254 | B1 | 3/2003 | Tomimatsu et al. |
| 6,579,665 | B2 | 6/2003 | Lee et al. |
| 6,581,023 | B1 | 6/2003 | Kim |
| 6,700,122 | B2 | 3/2004 | Matsui et al. |
| 6,753,535 | B2 | 6/2004 | Rose |
| 6,791,084 | B2 | 9/2004 | Shimoma et al. |
| 6,822,245 | B2 | 11/2004 | Muto et al. |
| 6,875,981 | B2 | 4/2005 | Nishikawa |
| 7,084,399 | B2 | 8/2006 | Muto et al. |
| 2002/0134949 | A1 | 9/2002 | Gerlach et al. |
| 2002/0144892 | A1 | 10/2002 | Lee et al. |
| 2002/0170675 | A1 | 11/2002 | Libby et al. |
| 2003/0047691 | A1 | 3/2003 | Musil et al. |
| 2003/0062487 | A1 | 4/2003 | Hiroi et al. |
| 2003/0174879 | A1 | 9/2003 | Chen |
| 2004/0031936 | A1 | 2/2004 | Oi et al. |
| 2004/0121069 | A1 | 6/2004 | Ferranti et al. |
| 2006/0060777 | A1 | 3/2006 | Motoi et al. |
| 2006/0097166 | A1 | 5/2006 | Ishitani et al. |
| 2006/0197017 | A1 | 9/2006 | Motoi et al. |
| 2007/0025907 | A1 | 2/2007 | Rezeq et al. |
| 2007/0051900 | A1 | 3/2007 | Ward |

FOREIGN PATENT DOCUMENTS

| | | |
|---|---|---|
| EP | 0 477 992 A2 | 4/1992 |
| EP | 1 491 654 | 12/2004 |
| GB | 1 604 898 | 12/1981 |
| JP | 63 045740 | 2/1888 |
| JP | 5209844 | * 12/1983 |
| JP | 63 045740 | 2/1988 |
| JP | 63 200434 | 8/1988 |
| JP | 1-130450 | 5/1989 |
| JP | 04 341743 | 11/1992 |
| JP | 07045230 | 2/1995 |
| JP | 2001 176440 | 6/2001 |
| WO | 98/47172 | 10/1998 |
| WO | 2001/04611 | 1/2001 |
| WO | 2004/068538 | 8/2004 |
| WO | 2006/133241 | 12/2006 |

OTHER PUBLICATIONS

"In-line holography using low-energy electrons and photons: Applications for manipulation on a nanometer scale", Heinz Schmid, Hans-Werner Fink, Jürgen Kreuzer, Journal of Vaccum Science & Technology B: Microelectronics and Nanometer Structures -- Nov. 1995 -- vol. 13, Issue 6, pp. 2428-2431.

Title: "Point source for ions and electrons", Authors: Fink, H.-W., Publication: Physica Scripta, vol. 38, p. 260, Publication Date: Aug. 1988, Origin: ADS 1988PhyS...38..260F.

"Atomic resolution in lensless low-energy electron holography", Hans-Werner Fink and Heinz Schmid, Hans Jürgen Kreuzer and Andrzej Wierzbicki.

Phys. Rev. Lett. 67, 1543-1546 (1991), [Issue 12 - 16 Sep. 1991]. Surface migration of "hot" adatoms in the course of dissociative chemisorption of oxygen on Al(111) H. Brune, J. Wintterlin, R. J. Behm, and G. Ertl, Phys. Rev. Lett. 68, 624-626 (1992) [Issue 5 - 3 Feb. 1992].

"Lattice Steps and Adatom Binding on Tungsten (211)" Fink, H W; Ehrlich, G Surf. Sci. vol. 143, No. 1, pp. 125-144. Jul. (II) 1984.

"Mechanical and electronic manipulation of nanometer-sized wires" H Schmid et al 1994 Nanotechnology 5 26-32 doi: 10.1088/4484/5/1/003.

Coherent point source electron beams Hans-Werner Fink, Werner Stocker, and Heinz Schmid Journal of Vaccum Science & Technology B: Microelectronics and Nanometer Structures -- Nov. 1990 -- vol. 8, Issue 6, pp. 1323-1324.

"Characterization fo atomic-size metal ion sources" S.T. Purcell and Ve Thien Binh Journal of Vaccum Science & Technology B: Microelectronics and Nanometer Structures -- Jan. 2001 -- vol. 19, Issue 1, pp. 79-86.

"Towards a commercial gas field ion source" William B. Thompson, Sigfried Kalbitzer, R. Percival and A.Saxonis, Christoph Wilbertz Proceedings of SPIE -- vol. 2437.

"Recent Progress in gas field ion source technology" Christoph Wilbertz, Thomas Miller and Sigfried Kalbitzer Proceedings of SPIE -- Vol. 2194.

"Mono-atomic tips for scanning tunneling micrscopy" Hans-Werner Fink, IBM J. Res. Develop. vol. 30, No. 5, - Sep. 1986.

Binh, V.T., "In situ fabrication and regeneration of microtips for scanning tunneling microscopy", J. Microscopy 152(2): 355-361 (1988).

Stocker, W. et al., "Low-energy electron and ion projection microscopy", Ultramicroscopy 31: 379-384 (1989).

Bell, A.E. et al., "High-field ion sources", Rev. Sci. Instrum. 61(1): 363-365 (1990).

Schmid, H. et al., "Combined electron and ion projection microscopy", Appl. Surf. Sci. 67: 436-443 (1993).

Muller, H.U. et al., "Emission properties of electron point sources", Ultramicroscopy 50: 57-64 (1993).

Horch, S. et al., "Field emission from atomic size sources", J. Appl. Phys. 74(6): 3652-3657 (1993).

Fink, H.-W. et al., "Electron and Ion Microscopy Without Lenses", *Nanostructures and Quantum Effects* (Springer-Verlag, 1994), pp. 17-27.

Edinger, K. et al., "Development of a high brightness gas field ion source", J. Vac. Sci. Technol. B 15(6): 2365-2368 (1997).

Horiuchi, K. et al., "Emission characteristics and stability of a helium field ion source", J. Vac. Sci. Technol. B. 6(3): 937-940 (1988).

Melngailis, J., "Focused ion beam technology and applications", J. Vac. Sci. Technol. B 5(2): 469-495 (1987).

Fu, T.-Y. et al., "Method of creating a Pd-covered single-atom sharp W pyramidal tip: Mechanism and energetics of its formation", Phys. Rev. B 64: 113401-1-4 (2001).

Lucier, A.-S., "Preparation and Characterization of Tungsten Tips Suitable for Molecular Electronics Studies", excerpts from MSc Thesis, McGill University, 2004.

Fotino, M., "Tip sharpening by normal and reverse electrochemical etching", Rev. Sci. Instrum. 64(1): 159-167 (1993).

Wengelnik, H. et al., "Oxygen-induced sharpening process of W(111) tips for scanning tunneling microsope use," J. Vac. Sci. Technol. A 8(1): 438-440 (1990).

Rezeq, M. et al., "Sharpening of a Field of Ion Microscope (FIM) Tungsten Tip by the Controlled Interation of Nitrogen with the Tip Surface Atoms," Abstract from APS Mar. Meeting (2004).

McGuinness, P.E., "Seeing at Atomic Resolution is Believing: Welcome the Helium Ion Microscope", Scanning 27(6): 323 (2005).

Notte, J. et al., "Sample Interaction and Contrast Mechanisms of the Helium Ion Microscope" (Scanning Conference, Apr. 2006).

Notte, J.A. et al., "An Introduction to Helium Ion Microscopy and its Nanotechnology Applications" (NanoScience and Technology Institute, May 2006).

Ward, B.W. et al., "The Helium Ion Microscope: A New Tool for Nanoscale Microscopy and Metrology" (Electron, Ion, and Photon Beam Nanotechnology Conference, May 2006).

Morgan, J. et al., "An Introduction to the Helium Ion Microscope" (Microscopy Today, Jul. 2006).

Hill, R. et al., "The ALIS He Ion Source and its Application to High Resolution Microscopy" (Seventh International Conference on Charged Particle Optics, Jul. 2006).

Notte, J. et al., "An Introduction to Helium Ion Microscopy" (Microscopy and Micro-Analysis, Jul. 2006).

"An Introduction to the Helium Ion Microscope" (Materials Research Society Meeting, Nov. 2006).

J. Melngailis, "Ion Sources for Nanofabrication & High Resolution Lithography," IEEE Proceedings of the 2001 Particle Accelerator Conference, Chicago, Illinoise, (2002).

K. Jousten et al. "Growth & Current Charities of a Stable field Ion Emitter," Ultramicroscope 26, pp.301-312 (1988).

Qing Ji, "Maskless, Resistless Ion Beam Lithography Process," Ph.D. Dissertation, Department of Electrical Engineering and Computer Sciences, UCAL Berkeley (2003).

Escovitz et al., "Scanning Transmission Ion Microscope with a Field Ion Source," Feb. 24, 1975, Proceedings of the National Academy of the Sciences, vol. 72, No. 5, Published May 1975, pp. 1826-1828.

Mutsaers, "Nuclear Microprobe Design," Nuclear Instruments & Methods in Physics Research, Section - B: Beam Interactions with Materials and Atoms, Elsevier, Amsterdam, NL, vol. 113, No. 1, Jun. 1996, pp. 323-329.

Jaksic et al., "New Developments in IBIC for the Study of Change Transport Properties of Radiation Detector Materials," Nuclear Intruments & Methods in Physics Research, Section - B: Beam Interactions with Materials and Atoms, Elsevier, Amsterdam, NL, vol. 158, No. 1-4, Sep. 2, 1999, pp. 458-463.

Butz et al., "From Micro- to Nanoprobes: Auspices and Horizons," Nuclear Intruments & Methods in Physics Research, Section - B: Beam Interactions with Materials and Atoms, Elsevier, Amsterdam, NL, vol. 113, No. 1, Jun. 1996, pp. 317-322.

Tondare V. N., "Quest for high brightness, monochromatic noble gas ion sources," J. Vac.Sci,Technol., A 23, 1498 (2005).

Grivet et al., "Ion Microscopy: History and Actual Trends," Ann NY Acad Sci, 1978 NY Acad of Sci, vol. 306, Feb. 23, 1977, pp. 158-182.

Magnan, "The Proton Microscope," Nucleonics, vol. 4, No. 4, Apr. 1949, pp. 52-66.

Chanson et al., "Sur les premieres images obtenues avec un microscope protonique," Comptes Rendus Hebdomadaires des Seances de l'Academie des Sciences France, vol. 233, Dec. 3, 1951, pp. 1436-1438.

Knoll et al., "Das Elektronenmikroskop" Zeitshrift fur Physik Germany, vol. 78, No. 5-6, Oct. 4, 1932, pp. 318-339.

Breese et al., "Ion optical study of a transmission ion microscope," Muclear instruments & Methods in Physics Research, Section - B: Beam Interactions with Materials and Atoms, Elsevier, Amsterdam, NL, vol. 158, No. 1-4, Sep. 2, 1999, pp. 236-240.

Valdiviez et al., "The mechanical design of a proton microscope for radiography at 800 MeV,"Institute of Electrical and Electronics Engineers: Proceedings of the 2003 Particle Accelerator Conference. PAC 2003. Portland, OR, May 12-16, 2003, Particle Accelerator Conference, New York, NY: IEEE, US. vol. 1 of 5, May 12, 2003.

Bunday et al., "Determination of optimal parameters for CD-SEM measurement of line-edge roughness," Metrology, Inspection, and Process Control for Microlithography XVIII, Proceedings of SPIE - The International Society for Optical Engineering, vol. 5375, pp. 515-533, May 24, 2004.

Hong-Shi et al., "Preparation and characterization of single-atom tips," Nano Letters, vol. 4, No. 12, pp. 2379-2382, Dec. 2004.

Itakura et al., "Focusing Column For Helium Field Ion Source," Microelectric Engineering, Elsevier Publishers BV., Amsterdam, NL, vol. 3, No. 1-4, pp. 153-160, Sep. 23, 1985.

Itakura et al., "Microprobe of Helium Ions," Journal of Vacuum Science and Technology: Part B, AVS / AIP, Melville, New York, NY, vol. 9, No. 5, pp. 2596-2601, Sep. 1, 1991.

Kalbitzer et al., "High-brightness source for ion and electron beams (invited)," Review of Scientific Instruments, American Institute of Physics, vol. 69, No. 2, pp. 1026-1031, Feb. 2, 1998.

Kalbitzer et al., "Ion beam modification for submicron technology," Nuclear Instruments & Methods in Physics Research, Section - B: Beam Interations With Materials and Atoms, Elsevier, Amsterdam, NL, vol. 113, No. 1, pp. 154-160, Jun. 1996.

Kalbitzer et al., "Multipurpose nanobeam source with supertip emitter," Journal of Vacuum Science & Technology B: Microelectronics Processing and Phenomena, American Vacuum Society, vol. 16, No. 4, pp. 2455-2461, Jul. 1998.

Kalbitzer, "Bright ion beams for the nuclear microprobe," Nuclear Instruments & Methods In Physics Research, Section - B: Beam Interactions With Materials and Atoms, Elsevier, Amsterdam, NL, vol. 158, No. 1-4, pp. 53-60, Sep. 2, 1999.

Kim et al., "Effects of low-energy (1-1.5 kV) nitrogen-ion bombardment on sharply pointed tips: Sputtering, implantation, and metal-nitride formation," Journal of Applied Physics, American Institute of Physics, vol. 81, No. 2, p. 944, Jan. 15, 1997.

Levi-Setti, "High Resolution Scanning Ion Probes: Application to Physics and Biology," Nuclear Instruments and Methods, North-Holland, vol. 168, No. 1-3, pp. 139-149, Jun. 25, 1979.

Levi-Setti, "Proton Scanning Microscopy: Feasiblity and Promise," Scanning Electron Microscopy. Proceedings of The Annual Scanning Electron Microscope Symposium, Chicago, IL., pp. 125-134, Apr. 11, 1974.

Liu et al., "A Study of Optical Properties of Gas Phase Field Ionization Sources," Advances in Imagin and Electron Physics, Elsevier Academic Press, vol. 138, pp. 147-175, Oct. 2005.

Orloff et al., "A Scanning Ion Microscope with A Field Ionization Source," Scanning Electron Microscopy. Proceedings of The Annual Scanning Electron Microscope Symposium, Chicago, IL, No. 10, pp. 57-62, Mar. 1977.

Orloff et al., "High-Resolution Focused Ion Beams: FIB and its Applications," Kluwer Academic / Plenum Publishers, New York, Chapter 6.8, (2003).

Orloff, "High-Resolution Focused Ion Beams," Review of Scientific Instruments, AIP, vol. 64, No. 5, pp. 1106-1107, May 1, 1993.

Stevie et al., "Focused Ion Beam Gases for Deposition and Enhanced Etch," Chapter 3 of Introduction to Focused Ion Beams - Instrumentation, Theory, Techniques and Practice, Edited by Giannuzi et al., Published by Springer, pp. 53-72, (2005).

Tondare et al., "The concept of a high-brightness, miniaturized gas field ion source," Vacuum Microelectronics Conference, 2003. Technical Digest of the 16th International IEEE, pp. 307-308, Jul. 7, 2003.

Wolf et al., "Design and performance of a scanning probe-hole field emission microscope," Surface Science, vol. 246, No. 1-3, pp. 420-427, Apr. 1991.

* cited by examiner

ATOMIC LEVEL ION SOURCE AND METHOD OF MANUFACTURE AND OPERATION

OPERATION

This application claims priority to provisional patent application Ser. No. 60/511,726 filed Oct. 16, 2003, the contents of which are incorporated in their entirety herein by reference.

BACKGROUND OF THE INVENTION

This invention relates to an ion source and more particularly to an atomic level ion source (ALIS) generating ions from a volume near the size of a single atom. The source of the invention can be used as the particle source in a charged particle microscope.

Charged particle microscopes typically use electrons or metal ions. Both microscopes are very well developed and reliable; however, the electron microscope has the highest resolution. An ALIS-type helium ion microscope would have a distinct advantage over electrons that are now in use in charged particle microscopes. Light ions significantly reduce the optical diffraction effects that electrons cause and they have a smaller interaction volume when focused onto the surface of a sample by a lens. Helium ions can also provide better chemical contrast than can electrons. Also, the source size is smaller than electron sources providing a smaller final spot size for a given optical condition. It is also believed that the coherence, or energy spread, of this type of ion source is better than electron sources minimizing chromatic aberration effects that cause resolution reduction.

Previous attempts have been made to produce a reliable atomic level ion source for use in a microscope application. For example, the Max Planck Institute is likely to be considered the most successful group for exploring such an ion source but the group failed at producing a reliable recipe for stable and repeatable commercial operation.

It is therefore an object of the invention to provide a very bright ion source that emits ions from an area near the size of an atom dimension because resolution is improved as ion source size is reduced and as brightness increases. Such a source incorporated into a typical ion electro-optical system will provide very high resolution pictures having near atom resolution.

SUMMARY OF THE INVENTION

In one aspect, the invention is an ion source including a single crystal metal conductor having a longitudinal axis. The metal conductor has a substantially conical tip portion having a rotational asymmetry about the longitudinal axis of no more than approximately 1:1.5. The tip portion of the source forms an approximately thirty degree angle and the tip portion terminates with a tip radius of curvature in the range of 50–100 nanometers with no more than three atoms on a top shelf. In a preferred embodiment, the single crystal metal conductor is tungsten wire having a <111> crystal orientation aligned to the longitudinal axis of the wire.

In yet another aspect, the invention is a method for making an ion source. The method includes providing a single crystal metallic wire and coating a portion of the wire with resist. The wire is immersed beyond the resist into an electrolyte within an etching fixture that also includes a counter-electrode. The wire and counter-electrode are connected to electronics to generate a selected number of pulses of a desired voltage and duration. The immersion depth of the wire may be adjusted during the etching step. A conical tip of a selected geometry is formed thereby. In a preferred embodiment the wire is tungsten having a 0.25 millimeter diameter and is single crystal with a <111> crystal orientation. A suitable electrolyte is 2.5M sodium hydroxide. A preferred counter-electrode is stainless steel. In a preferred embodiment of this aspect of the invention the desired voltage is about 5 VAC full wave. The electronics deliver approximately 100 pulses of approximately 580 millisecond duration followed by approximately 60 pulses of approximately 325 millisecond duration. In one embodiment, the immersion depth of the wire is adjusted in approximately 50 μm increments during the 325 millisecond duration pulses. The process further includes delivering 35 millisecond pulses until tip drop-off occurs. After drop-off, it is preferred to apply a single pulse of 35 ms followed by a single pulse of 17 ms. Another embodiment includes a surfactant added to the electrolyte to improve symmetry of the resulting tip.

In yet another aspect, the invention is a method for sharpening the ion source including installing a tungsten wire source pre-etched to a tip diameter between 50–100 nanometers into the source assembly of a scanning ion microscope (SFIM) operating in an ion mode in the presence of helium at Ln2 temperatures. Field evaporation of the wire surface is performed until an ordered structure is imaged and the structure is atomically clean. This process is well known in the field of "Field Ion Microscopy." The helium gas is then pumped out and the system is changed to electron mode. The extraction voltage of the source is adjusted to approximately −50 picoamps of extraction current and a filament heater is turned on to a current of approximately 4.5 amps to heat the source to approximately 1500° C. The filament takes 10 s of seconds to heat up to the point that it emits visible light due to the fact that the filament is at Ln2 temperatures. A filament observation device is used to observe the first appearance of human visible light from the filament. The power to the extractor and filament is turned off 10–30 seconds after the first appearance of said light.

In still another aspect, the invention is a scanning gas ion microscope. The microscope includes an ion source comprising a single crystal metal terminating in no more than three atoms in a top shelf. An aperture is provided to block ions from all but one of the atoms. The single atom source produces high current and source brightness. The microscope's optical configuration will mostly conform in design to the commercially available Gallium Ion columns (such as those provided by FEI Company of Oregon) which have been available to customers for more than 20 years. It is well established in the art that virtually all ion sources produce neutral beams and the ion source of the invention is no exception. Although the microscope can operate with the presence of this neutral beam a simple electro-optical steering device can eliminate most, if not all, of this neutral beam. An example of such a device is a mechanical means of slightly tilting the source and its projected rays followed by an electrostatic deflector to bend the rays back onto the optical axis. Yet another method to remove neutral rays is to axially offset the source rather than tilting it and, again, employ an electro-optical device to bring the source rays back on axis with the microscope optic. Other techniques are also available.

The ion source of the present invention provides long term performance and reliability. The ion source of the invention has provided dependable angular intensities for helium in the 0.2–0.5 μA/sr range from groups of atoms and peak measurements of over 1 μA/sr from single atoms.

Source size has been measured that provides a minimum source brightness estimate of 5×10$^6$ A/cm$^2$-sr at 30 keV.

DESCRIPTION OF THE PREFERRED EMBODIMENTS

Figure 1:
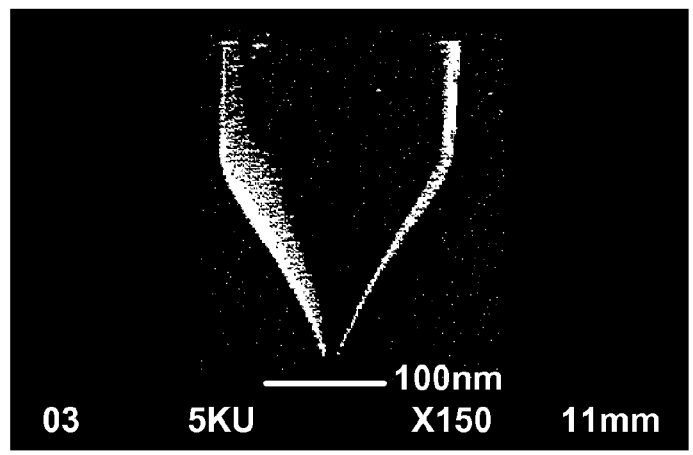
FIG. 1 is a photomicrograph of an ion source tip according to the invention.
Figure 2:
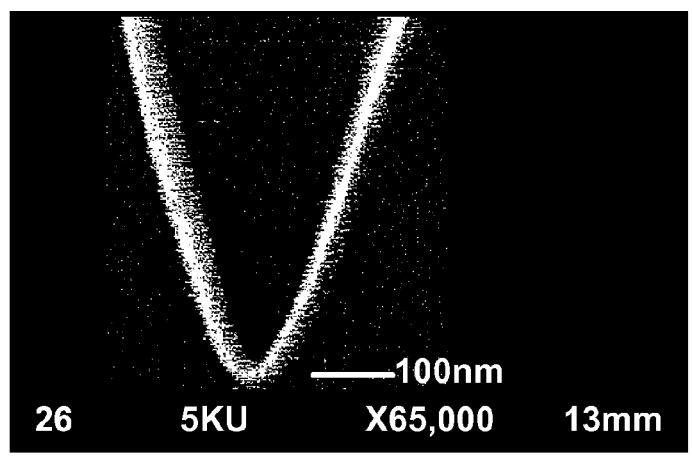
FIG. 2 is a photomicrograph, at higher magnification, of a tip of the invention.
Figure 3:
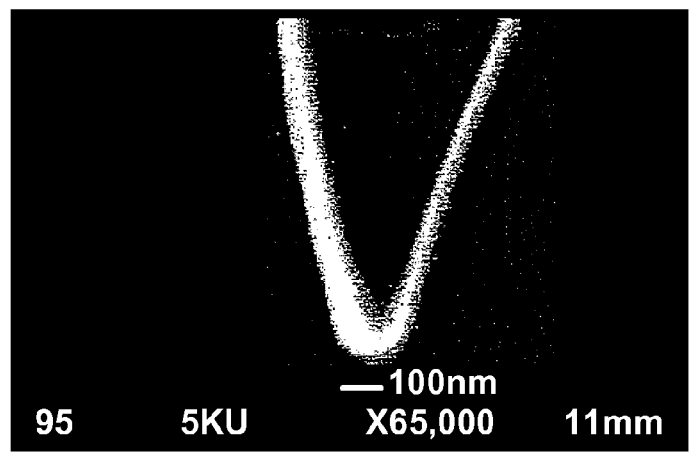
FIG. 3 is a photomicrograph of a tip that is too asymmetric to be useful for practicing the invention.

An ion source tip according to the invention is shown in FIG. 1. FIG. 1 is a scanning electron microscope photomicrograph at 150×. The tip is made of single crystal tungsten. As shown, the tip is substantially conical with a cone angle of approximately 30°. FIG. 2 is a photomicrograph at approximately 65,000× magnification showing that the tip radius of curvature is in the range of 50–100 nanometers and more preferably is in the range of 75–100 nanometers. Importantly, the tip should be substantially rotationally symmetric so that views of the tip rotated 90° on a longitudinal axis would show no more than 1:1.5 asymmetries when the views are compared with one another. A cone angle of approximately 30° provides a desired cone length. The resulting short cone length is preferred since the tip will be more robust. A longer and narrower tip geometry than shown in FIG. 1 will be prone to damage more readily from physical shock, electrical arcs and/or high electric field strengths. Tip symmetry is also important. FIG. 3 is a photomicrograph of a tip exhibiting asymmetries that make it less suitable for use as an ion source in the present invention.

A preferred embodiment of the process for making the tip illustrated in FIGS. 1 and 2 will now be discussed. The process according to this embodiment of the invention begins with a single crystal metallic wire such as 0.25 millimeter diameter <111> single crystal tungsten wire. Suitable wire may be purchased from FEI Beam Technology of Hillsboro, Oreg. The wire is cut into approximately 5 millimeter lengths for subsequent fabrication of the atomic level ion source tip of the invention. Starting with a serialized and clean source base available, for example, from AEI, a 0.178 mm diameter polycrystalline tungsten wire is spot welded to the base using standard settings and dimensions as known for liquid metal ion source fabrication. The apex area of the filament wire is briefly etched in 1N NaOH at 1 VAC to clean the wire surface. The assembly is then cleaned ultrasonically for ultra high vacuum (UHV). A purpose-built spot welder using a pressure setting of 1 and a long pulse of 11-watt seconds is used to weld the single crystal wire to the polycrystalline tungsten filament.

Next, the single crystal tungsten wire is prepared for the etching process by covering approximately 0.5 mm of the end of the single crystal tungsten wire with a resist. The resist coating may be achieved by placing a drop of resist solution onto a clean surface and dipping the end of the wire into the resist five or six times, allowing the resist to dry slightly on the tip between dips. The resist aids in allowing a minimal amount of wire to be expended in the etching process, thereby allowing for reformation of a new tip on the same piece of single crystal wire, providing maximum utilization and economy. About 5 to 6 tips can be formed on one 5 mm tip wire.

Figure 4:
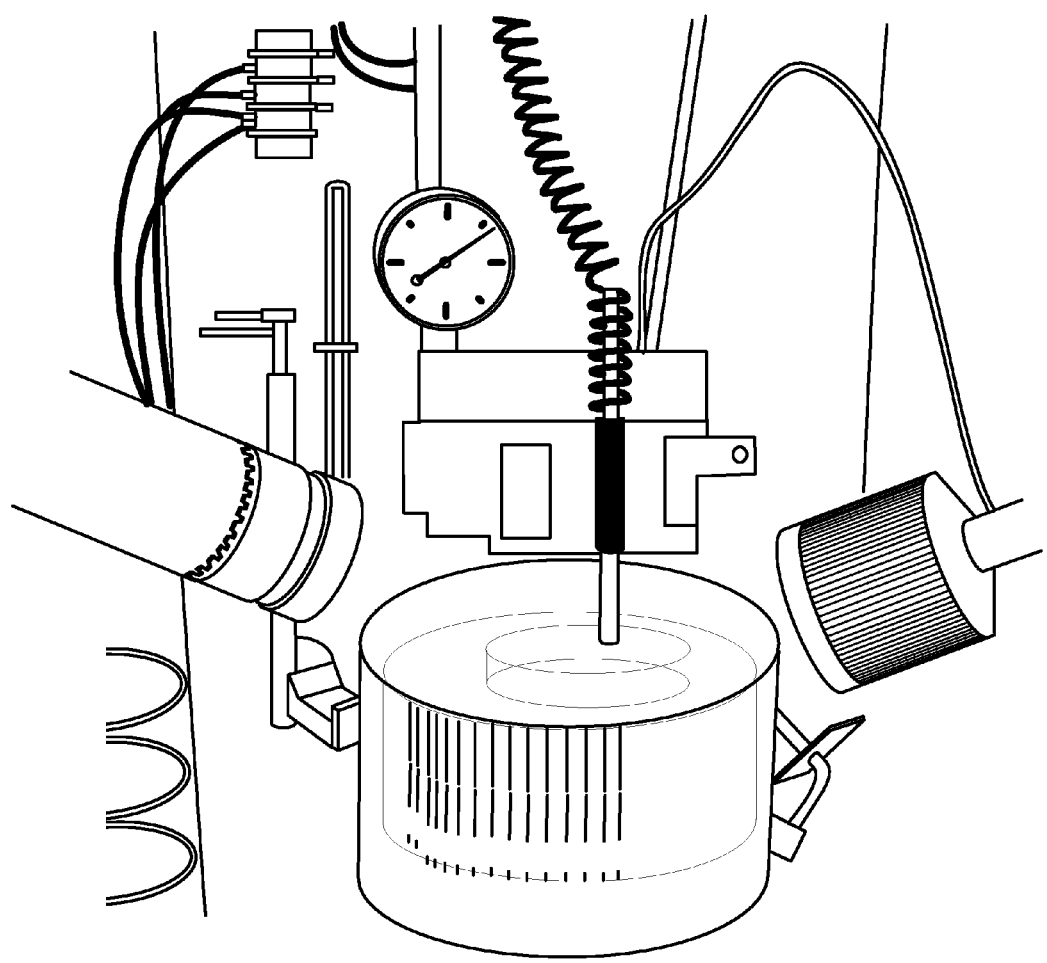
FIG. 4 is a perspective view of an etching fixture used in the practice of the invention.

The ion source tip assembly is then placed into an etching fixture shown in FIG. 4. A 90×50 mm crystallization dish of the etching fixture is filled with 150 ml 2.5M NaOH. The etching fixture contains a stainless steel counter electrode (not shown). The source assembly is lowered into the electrolyte using a motor drive until the end of the tip comes into contact with the electrolyte. The tip is lowered further until the resist interface is just in contact with the electrolyte, and then the tip is lowered an additional 0.2 mm. This lowering is monitored by the operator with a video microscope and displayed on a monitor.

Etching electronics are then connected to the tungsten source to be etched and the counter electrode. In this embodiment, the electronics provides 5 VAC (±0.5 VAC) full wave in pulses of controlled durations for the drop-off etching process. A suitable etching regimen begins with the application of approximately 100 pulses having a 580 ms duration. Thereafter, approximately 60 pulses are applied having a 325 ms duration. During these 325 ms pulses it will likely be necessary to adjust the immersion depth of the source wire in small increments, 50 μm on average, to maintain the electrolyte approximately midway on the cone that has started to develop. The etching process is then continued by setting the pulse duration to 35 ms and pulses are applied until drop-off of the tip is achieved. It will usually be necessary to modulate the immersion depth to maintain the desired electrolyte level. As the drop-off point is approached (a point at which the necked portion becomes very thin) one should proceed cautiously. After drop-off, the end of the tip is just immersed in the electrolyte and a single pulse of 35 ms is applied followed by a single pulse of 17 ms.

After tip drop-off, the assembly is carefully removed and rinsed with distilled or deionized water. One then carefully blow-dries the source starting at the tip with 2 to 3 lbs. of DN$_2$.

The atomic level ion source is then loaded into a scanning electron microscope capable of clearly resolving the tip. A JEOL 6400F SEM is suitable. The tip is then examined at 150× to determine whether the desired aspect ratio of cone length to wire diameter has been achieved, as discussed earlier in this specification. A short cone length is desired since the tip will be more robust, and the desired cone length is achieved by the initial immersion depth along with properly modulating the immersion depth of the tip during the etching process.

Next, the tip is examined at 65,000× in two orthogonal views to assess rotational symmetry and tip end radius of curvature. Methods have been developed to modify a too sharp or narrow tip without having to start the etch process over. Typically, 1 to 3 pulses of 35 ms duration with the tip barely immersed in the electrolyte works well for this purpose. If the tip has the desired characteristics discussed above, it is removed from the SEM and stored until used.

The present process differs from that typically used for fabricating field ion microscope (FIM) tips that achieve a tip that is very narrow and sharp. Such tip geometry is prone to damage more readily from physical shock or high electric field strengths. The technique of the invention described above results in a less sharp tip angle with the required radius. The above-described recipe of AC pulse durations with a specified number of pulses for each pulse duration gives the desired tip but those skilled in the art will recognize that other regimens maybe be utilized. It was also determined that tip radius can be controlled with the above-described process very well. Although tip angle was found to be controlled most of the time, sometimes a narrow tip angle resulted. We discovered that by applying a small number of short duration pulses to a tip that was too narrow, the tip angle could be increased without causing the tip to become larger in radius initially. In fact, sometimes the result was a narrow tip that had a large radius; it was found that such a source could be given a larger tip angle while decreasing the tip radius. It was sometimes found that the tip radius would start to increase at a considerable rate. We could not reduce the radius of a tip once it reached a radius greater than 200 nanometers.

The one aspect of tip geometry that could be quite random at times is the symmetry of the tip about its longitudinal axis. Sometimes the tip could be as much as 3 or 4 times wider in one plane compared to the one normal to it. It has been discovered that a small amount of a surfactant added to the electrolyte would result in tip geometries that were much more symmetric. The use of a surfactant was used to make approximately 6 tips. However, when forming an FIM image of these tips we could not discern a clear ordered structure with some amount of effort. Since there is a question that the surfactant may adversely affect the crystal morphology, we abandoned this approach and settled on an acceptable limit to the asymmetry of the tip as discussed above. We have found that the procedure disclosed herein reliably produces suitable tip geometries for an atomic level ion source and yield has increased to approximately 70%.

After the electrochemical processing discussed above, the ion source of the invention is sharpened in situ. The source is installed in the source assembly of a scanning ion microscope, cooled to near Ln2 temperature and the system is turned on in the ion, SFIM, mode with a helium gas pressure of approximately $5 \times 10^{-6}$ torr and the structure is imaged. Next, field evaporation of the surface is performed until an ordered structure is imaged. This step is very important for two reasons. One, it demonstrates the source is now clean of contaminants that would prevent the sharpening process from working properly, and two, it allows one to examine the source for a variety of other problems. Field evaporation occurs at a potential slightly above the typical FIM mode voltage. Once an image is in focus the potential is raised a small amount at a time until the field starts to pull off all loosely bonded atoms from the tip. One must be careful not to increase the potential too rapidly because groups of tungsten atoms can be pulled off and cause a crystal void. This process continues slowly until one determines that the W <111> structure is atomically clean.

Figure 5:
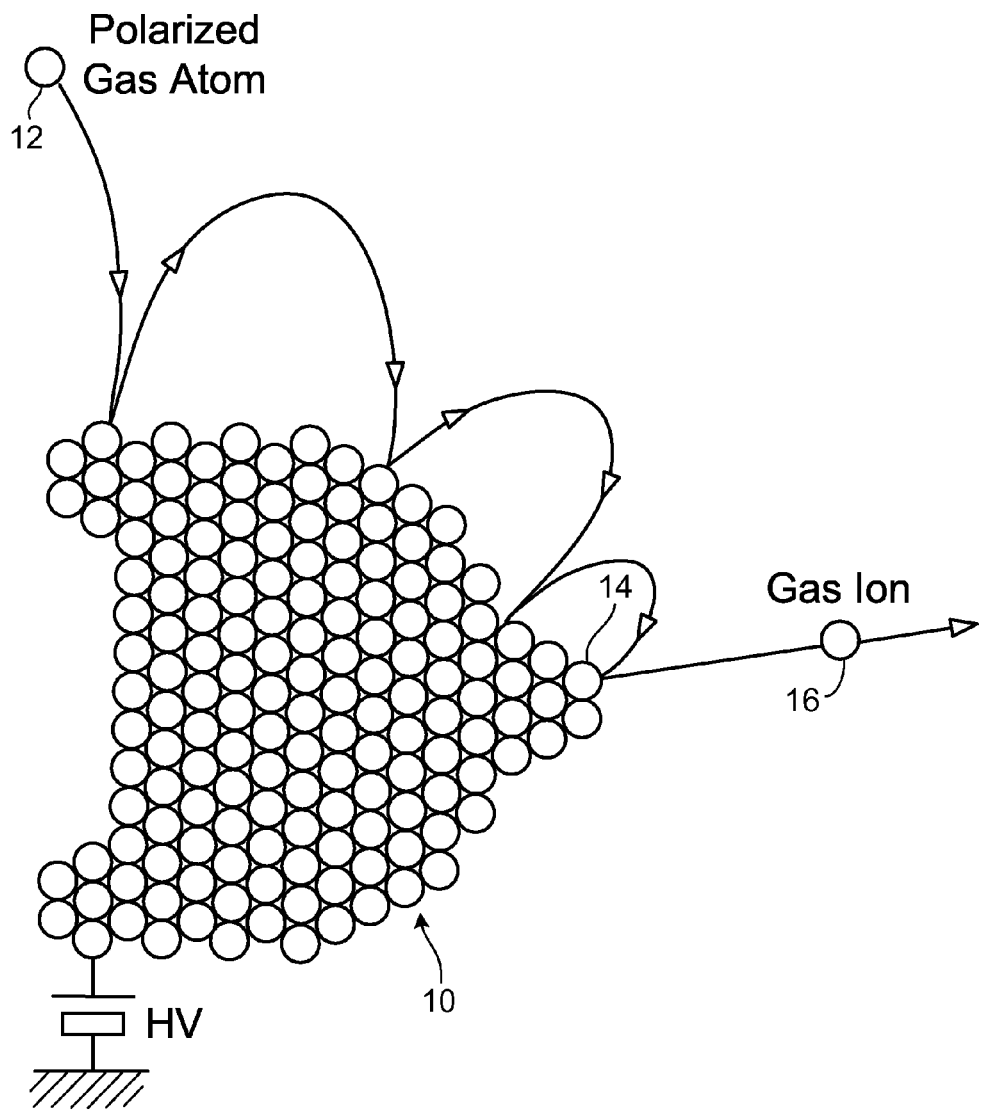
FIG. 5 is a schematic illustration of a source according to the invention having a three atom top shelf.

At this point, the helium gas is pumped out and the system is changed over to electron mode from ion mode. A phosphor-coated glass screen is positioned in the beam path of the column and is used to monitor beam current and observe photons induced by electrons to verify the electron lens is adjusted properly. An electrometer monitors beam current. The extraction voltage of the source is adjusted until −50 picoamps is indicated. A filament heater is then turned on to a current of 4.5 amps that will produce a temperature of about 1500° C. on the source. The current and temperature will vary slightly depending on the actual tip length. The phosphor coated glass screen is monitored visually on a video monitor until light from the source is bright enough to illuminate the screen. (The phosphor coating does not produce this light. It is there for experimental purposes only.) (Light from the filament will pass through the phosphor screen.) Approximately thirty seconds after the first sign of light, the power switch to the extractor and filament is turned off. During this process one will notice that the electron current will rise from the −50 pA value to approximately 2 to 3 times that value, then dip to less than −50 pA and then rise again to −700 to −1000 pA. At this point the source has completed its sharpening process and is ready for column alignment. FIG. 5 is an illustration of a sharpened atomic level ion source 10 having a 3 atom top shelf and interacting with a polarized gas atom 12. The gas atom 12 becomes ionized and leaves the source 10 from a top shelf tungsten atom 14 as a gas ion 16.

Two separate alignment steps are necessary to properly operate the atomic level ion source (ALIS) disclosed herein. The first step, a crude alignment procedure, is needed only once, when a new source is installed. The second step is a fine optical alignment procedure typical of any charged particle beam machine. The limited field of view of the system really affects only the crude alignment process when the center of the <111> crystal axis is being searched for. This crude alignment process usually takes about an hour. The second, fine alignment procedure utilizes the common "Minimize-Lens-Sweep" method to precisely steer the source straight down the optical path. Simple algorithms for both the source and aperture alignment are now routine and repeatable. A fine column alignment is necessary after sharpening an ALIS source. If the column suffers from a poor thermal design it must be partially aligned, by electrostatic means, several times an hour with a small adjustment to the upper octopole.

Figure 6:
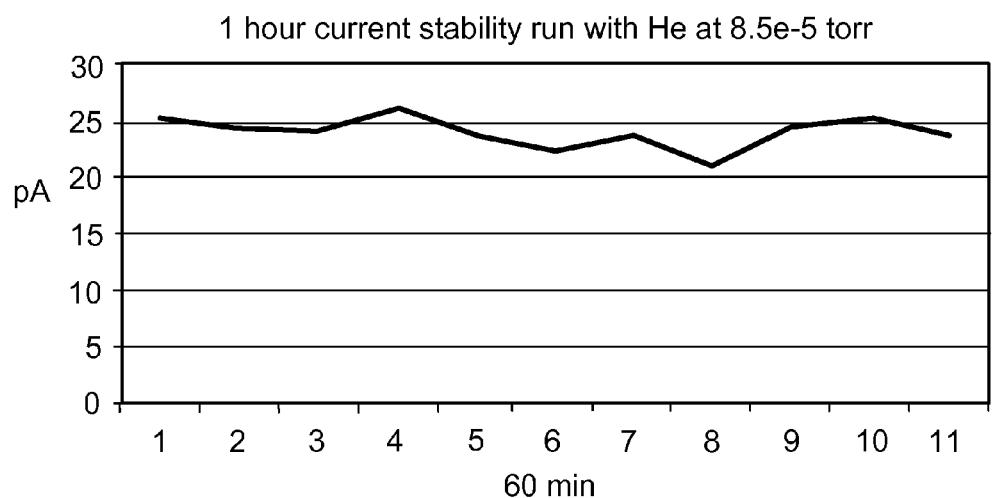
FIG. 6 is a graph of current as a function of time illustrating source stability.

Experiments with the sharpened tip demonstrated acceptable current stability. It was also established that current stability is degraded by contaminants in the gas feed. FIG. 6 illustrates current stability in an experimental run with helium.

Multiple ion sources made by the sharpening recipe and manufacturing processes disclosed herein displayed very much the same characteristics. With tip radii now held to a tolerance of 50 to 100 nm, the operating parameters of the optical system stayed in a comfortable and familiar range. (With a modification to the optical design one could easily use much larger tip radii.) We intentionally tried to stay below 30 kV extraction voltages to minimize arcing and potential source damage. Future gun designs can eliminate this risk but, at this point, we do not see a benefit to operate in that regime. Several sources were sharpened more than 10 times in the optical column, demonstrating consistent repeatability of the process. In one experiment, we took FIM images of the source as we intentionally sharpened and blunted it 27 times in a single morning in a source test stand. Each time the source returned to its original operating I/V condition.

The sources made according to this invention have very long life. One source lasted two months and would have continued to run if it had not been poisoned by a bad helium bottle exchange. It is believed that the sources of the invention can run at least a year given properly filtered gas and an arc-free gun design. Experiments have shown that the sources can be sharpened as often as needed in order to restore the original source condition at any time.

The ions produced by atoms on the top atomic shelf (see FIG. 5) of the source are the only ones passed through the optical system. Ions produced by other lower shelves are stopped by a limiting aperture. Column designs may include a spray aperture before the first lens to better eliminate these unwanted beams. The population of the top ten or so shelves determines the overall source characteristics, but the top shelf is the most important. We have gained significant experience now with three atom top shelves and have typically used a single atom out of the three for the ion source. Typical currents from a 3-atom source are about 100 pA from each atom. Other top shelf populations such as 7, 12 or more have been tried as well. To adjust the population we image the source in the SFIM mode with helium and bring up the extraction voltage very slowly until field evaporation of the tungsten begins. It is desired to field evaporate down to a 3-atom top shelf. A simple voltage pulsing circuit can be implemented to provide a more controllable process. Due to the crystalline nature of the source and a natural desire for symmetry in high electric fields, certain natural population counts are easy to achieve. The detailed process used to define the final end form of the source is described next.

We will assume that the source has already been operated in FIM mode and the electron source building technique has already taken place. At the outset, one makes sure that the source Dewar is filled with liquid nitrogen and the base pressure of the gun is in the range of $1.0-3.0 \times 10^{-9}$ torr. The aperture blade is pulled out of the beam line and the high voltage supplies are turned on to enable a high voltage. Ion mode is selected and the field of view is set to 1350 µm or lowest possible magnification. The upper scan is turned off and the gain of MCP is set to maximum. Rastering at a fast rate of 256 scan raster is begun. The acceleration voltage is slowly raised to 6–8 kV while keeping the L1 focus voltage at 80% of the acceleration potential.

Helium gas is fed into the column to a level of about $2.0 \times 10^{-6}$ torr. This pressure will allow more control of field evaporating of the source as compared to using a higher pressure. The acceleration voltage is slowly raised in conjunction with sweeping the L1 lens voltage plus and minus 20% of the acceleration voltage. Usually around 12 kV acceleration the source begins to emit. Very carefully raise the potential while watching the source field evaporation occurring. The atoms that appear to be the brightest are usually the ones that will be pulled off the source next when gently raising the acceleration potential. The process ends with a shelf that contains 3 atoms. At that point, begin to lower the acceleration potential, keeping the L1 voltage at 80% of the acceleration potential and look for best focus condition of the atoms. Next, pick one of the 3 atoms and adjust the tilt of the source while wobbling L1 so that there is no sweep of the selected single atom. Then the source-offset alignment is adjusted to place the single atom in the middle of the field of view. The helium pressure is then brought up to $5 \times 10^{-5}$ torr. Next, put an aperture into the beam path and by driving the x and y axes of the aperture, re-center the atom in the field of view. At this point the lower scan is turned on to begin to image as a scanning ion microscope.

The 3-atom source is one of the easiest top shelf populations to create and produces a fair image of at least 0.2 µm resolution without a beam-defining aperture. This source easily provides 100 pA per atom in symmetrically diverging angles into the optical system. The only problem with using all three atoms as a source is that the resolution does not get much better as smaller apertures are used, as would be expected. The reason for this situation is that our beam defining apertures vignette the periphery of a beam in transport allowing only the central rays to pass into the next optical element. Most of the current is transported in the periphery of the beam, when using all three atoms, and all of the areas of high-angle intensity are excluded by an aperture.

By tilting the source one can easily and repeatedly align a single atom of a 3-atom top shelf on the optical axis. Although this may sound difficult, it is a routine that is quite simple and that is practiced readily. Even though the source magnification is several million by the time it hits the first defining aperture, the source positional adjustments are only magnified, or de-magnified, by the optical system like any other source. Results from the single atom source are spectacular, and the angle intensity is maximum for paraxial rays, unlike a 3-atom source. 100 pA can easily be produced from a single atom in the present gun under normal operating parameters and 300 pA have been measured at high pressure for a few seconds. The measured beam performance, with He, is a probe diameter of less than 15 nm at 30 pA. Higher currents and source brightness can be obtained with larger tip radii. Our guns have a safe limit of about 30 kV, but better designs might provide a 2 to 5 times increase in total current.

Top shelf populations of seven or more have produced typical current intensity of 0.2–0.5 µA/sr in the FIM source test stand, but they do not seem to produce good resolution in the optical column. The main reason for this, we believe, is the lack of a spray aperture before the first lens. We tried moving the LMIS source very close to the first lens in the gallium-based columns, only to find that the stray outer rays could not be removed by post-lens apertures, regardless of their position. Large top shelf populations can only be produced by significant rounding of the emitter tip. In this case the difference in the electric field between the top shelf and the lower shelves is minimal, providing enough field for their ridge atoms to emit significant current at very high angles. We believe that the source will perform well in a properly designed column. As smaller beam-limiting apertures are introduced we will select fewer and fewer atoms, which will in turn reduce the angle of the bundle, much like any other source. Populations of more than 50 atoms have been observed in the ion-source test stand with angular intensities of better than 0.3 µA/sr being observed. It is our experience that the best resolution will be provided when only a single atom is selected as the ion source and that a top shelf of less than 4 atoms is the best mode of this invention.

Minimization of the contaminants that reach the source tip is key to the success of the ALIS source. Reduction of the introduction of contaminants as well as source protection techniques have been developed that have produced very stable He ALIS performance.

UHV conditions in the gun were, at first, thought to be one of the most important issues that affected source life and stability. We typically operate the source with beginning gun pressures in the low $10^{-9}$ torr range. Our collected opinion is that most contaminants that affect source stability are introduced by the imaging gas delivery system and very little, if any, are provided from the gun atmosphere itself. RGA analyses of the gun region vacuum show typical results for the vacuum (and it may be that the water in the gun might actually be beneficial in the source sharpening when the "heat only" process is executed.) The total indicated pressure may be fairly unimportant. However, we are not suggesting the use of non-UHV materials such as o-rings. It is the partial pressure of a few, yet to be identified, materials that is the concern—probably N or CO. Gas purity, without question, is the single most important issue concerning ALIS source stability and lifetime. Now that the source design and operational issues have been solved this remains the final issue to be attacked. The recent observations of the two He bottles operating radically differently is testament to the importance of this issue.

Figure 7:
FIG. 7 is an FIM photomicrograph image displaying a typical, atomically clean tungsten needle without the final sharpening process.
Figure 8:
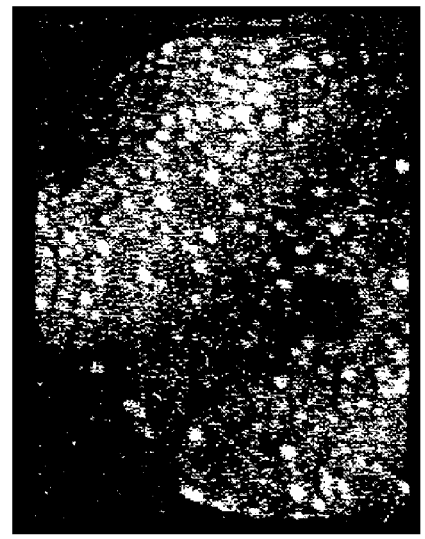
FIG. 8 is an FIM photomicrograph of the same needle of FIG. 7 after high voltage was turned off without the final sharpening process for a period and then turned on again under flowing gas.

High electric fields at the source tip are an important part of contamination control as well. In the FIM community, it is well understood that high electric fields will ionize many of the destructive contaminants that arrive near the source tip, preventing them from chemically interacting with the source substrate. We selected He for our imaging gas because it's ionization energy is 24.6 eV. The ionization potential of Ne is 21.6 eV, which is also a fairly high value. A simple experiment easily demonstrates how high electric fields shield the source. FIG. 7 is a FIM image displaying a typical, atomically clean, <111>- oriented tungsten needle and FIG. 8 is the same tip after the high voltage was turned off for 10 seconds then turned back on, while the gas continued to flow. The large number of adsorbents that have contaminated the surface are obvious. In practice, we never turn off the high voltage on the source once it has been sharpened. If this accidentally occurs, and the gas is not flowing, we simply re-sharpen the source with the standard procedure discussed above.

The mere existence of an FIM image dictates, from a simple geometric viewpoint, that the imaging ions originate from an ionization volume smaller in size than the distance between the adjacent atom's ionization volume. From the photographic evidence at BIV conditions as well as the reported theoretical work, one can imagine that about 50% of the imaging ions are produced in a volume, above each substrate atom's position that probably measures in size to be less than ½ the actual distance between the adjacent atom's ionization volume. Given this simple truth, if one traces the rays back in an optical system to the volume of origin, one can find a source size that is, at least, less than the distance measured between each atom's separate ionization volumes. This all being true, and taking into account how close to the surface atoms the imaging gas is ionized, the maximum source size is certainly not larger than a nanometer and likely as small as a few angstroms, and perhaps as small as a sub-angstrom dimension.

The other photographic evidence provided by an FIM allows one to quickly imagine what the virtual source size is as well. In an FIM image, the distance between atoms and the size of each individual atom seem proportionally unchanged as the FIM magnification is varied (by modifying the distance between the source and the imaging screen). This simple observation allows one to estimate the angle of all of the rays impinging upon the imaging screen. It also allows one to back-trace those rays towards the source, through the volume of ion production, to a virtual source below the volume of ionization. From a simple geometric viewpoint this virtual source size would be extremely small. However, optical distortions exist that blur the rays to a larger dimension. In our work we have regularly observed different shaped atom images, some appear to be round while other atom images are more oval in shape. Aberrations in the electric field occur on a regular basis on the ridge atoms of the sharpened crystal protruding planes that cause these oval shaped atoms. This observation indicates electric fields at the substrate surface that are significantly non-uniform at certain locations. The observed images of these oval shaped atoms have aspect ratios that vary from close to 1 to greater than 3:1. We also see distorted, individual, ion images if an FIM tip is damaged at the edges of multi-atom occlusions. One also sees slight differences in atom shapes when comparing the edge atoms to the center atoms of a single atomic shelf of a perfectly normal, undamaged, FIM tip. We have, on occasion, used slightly oval atoms as a source with, apparently, normal results a few times and my guess is that the most significant aberration is simple astigmatism. Assuming that the above information about varying field uniformities is true, one must assume that aberrations in the electric fields between atoms in the center of a shelf probably exist, to some degree, as well. My guess is aberrations on a flat plane only slightly confuse the projected rays back to the virtual source and therefore virtual source sizes of sub-angstrom dimensions are likely. A study of these non-round shapes compared to the observed FIM structure may provide empirical information that would allow one to calculate the local electrical fields in the non-uniform regions. This information might be useful in calculating the aberrations on a flat atomic shelf providing insight to better estimate the virtual source size. This information may already exist in the literature.

With an angstrom level virtual source size and its known low energy spread, one could make a scanning beam microscope with a resolution unmatched by available charged particle optical devices.

Figure 9:
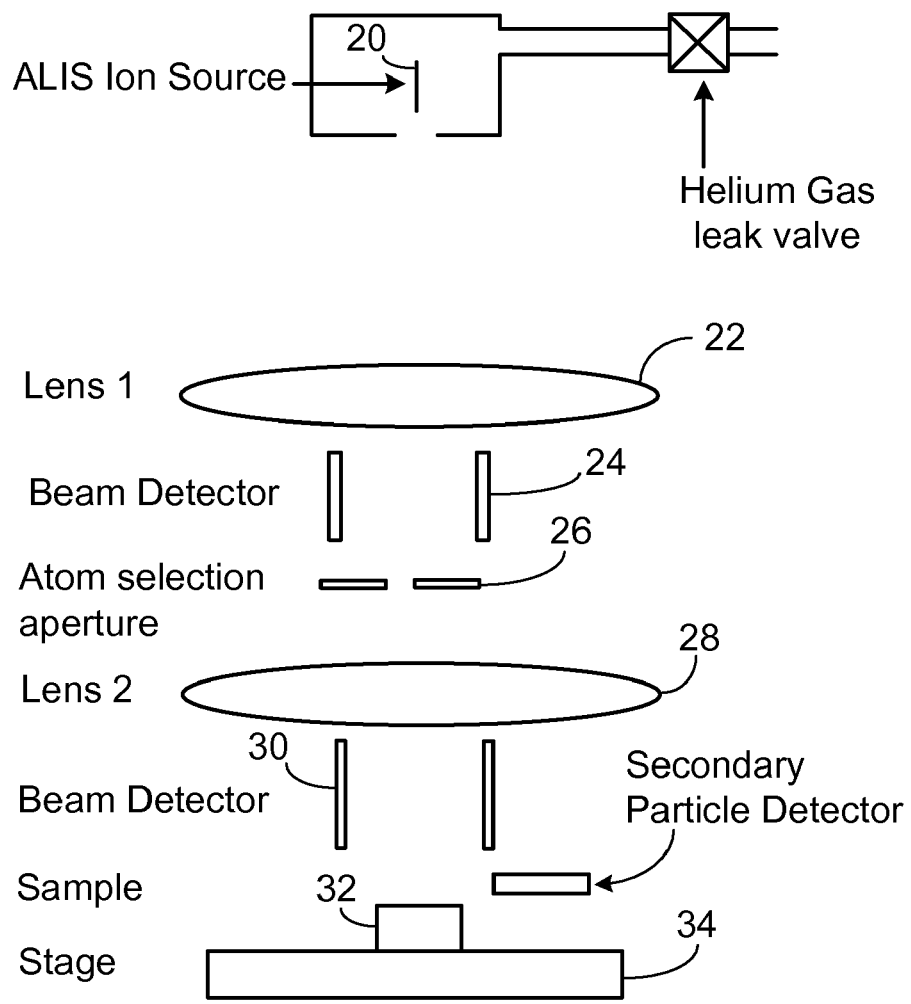
FIG. 9 is a schematic illustration of a helium ion microscope according to one embodiment of the invention.

A scanning helium ion microscope is shown in FIG. 9. An ALIS ion source 20 generates helium ions. The ions pass through a first lens 22, a beam deflector 24 and then through an atom selection aperture 26. As discussed above, the source 20 is adjusted so that the atom selection aperture 26 blocks ions from all but one of the atoms in the top shelf of the ion source 20. The ions continue through a second lens 28 and then through beam deflector 30 before impinging upon a sample 32 supported on a stage 34.

It is recognized that modifications and variations of the present invention will occur to those of ordinary skill in the art and all such modifications and variations are intended to be included within the scope of the appended claims.

What is claimed is:

1. Ion source comprising:
   a single crystal metal conductor having a longitudinal axis;
   the metal conductor including a substantially conical tip portion having rotational asymmetry about the longitudinal axis of no more than approximately 1:1.5;
   the tip portion forming an approximately 30% angle; and
   the tip portion terminating with no more than three atoms on a top shelf.

2. The ion source of claim 1 wherein the metal conductor is tungsten.

3. The ion source of claim 2 wherein the crystallographic orientation of the tungsten is oriented such that the <111> crystal plane is mostly aligned with the longitudinal axis.

4. Method for making an ion source comprising:
   providing a single crystal metallic wire;
   coating a portion of the wire with resist;
   providing an etching fixture including an electrolyte and a counter electrode;
   immersing the wire beyond the resist into the electrolyte;
   connecting the wire and counterelectrode to electronics to generate a selected number of pulses of a desired voltage and duration; and
   adjusting the immersion depth of the wire, wherein a conical tip of a selected geometry is formed.

5. The method of claim 4 wherein the wire is tungsten.

6. The method of claim 4 wherein the wire is approximately 0.25 mm in diameter.

7. The method of claim 4 wherein the single crystal metallic wire's crystalographic <111> plane is aligned with the longitudinal axis of the wire.

8. The method of claim 4 wherein the electrolyte is NaOH.

9. The method of claim 4 wherein the counterelectrode is stainless steel.

10. The method of claim 4 wherein the desired voltage is 5 VAC full wave.

11. The method of claim 4 wherein the electronics deliver approximately 100 pulses of approximately 580 ms duration followed by approximately 60 pulses of approximately 325 ms duration.

12. The method of claim 11 wherein the immersion depth is adjusted in approximately 50 μm increments during the 325 ms pulses.

13. The method of claim 11 further including delivering 35 ms duration pulses until tip drop-off occurs.

14. The method of claim 4 further including adding a surfactant to the electrolyte.

15. Method for sharpening an ion source comprising:
installing a tungsten <111> wire source pre-etched to a tip diameter between 50–500 nanometers into a source assembly of a scanning ion microscope system;
operating the system in an ion mode in the presence of helium to perform field evaporation of the wire surface until an ordered structure is imaged and the structure is atomically clean;
pumping out the helium gas and changing to electron mode;
adjusting extraction voltage of the source;
turning on a filament heater;
visually monitoring the source for the appearance of light; and
turning off the filament heater and extraction voltage a selected time after first appearance of light.

16. The method of claim 15 wherein the selected time is approximately 30 seconds.

17. The method of claim 15 wherein the extraction voltage is adjusted to generate −50–100 picoamps.

18. The method of claim 15 wherein filament heater current is approximately 4.5 amps.

19. The method of claim 15 wherein the source is heated to approximately 1500° C.

20. Scanning gas ion microscope comprising:
a gas field ion source comprising a single crystal metal terminating in no more than three atoms in a top shelf; and
an aperture adapted to block ions from all but one of the atoms.

21. The apparatus of claim 20 wherein said ion source produces both a charged beam and a neutral beam and, via optical and or mechanical means, the neutral beam is mostly removed from said charged beam before it strikes a microscope sample.

22. The apparatus of claim 20 wherein said ion source can be observed via the technique of Scanning Field Ion Microscope.

23. A Scanning Field Ion Microscope comprised of the following:
a. An ALIS ion source, or a similar ion source such as a "gas field ion source" or a typical "field ion microscope" sample needle, which, when operated in its normal mode, projects rays which travel through vacuum space and impinge a solid, electrically conducting, plate which contains a hole;
b. An electro-optical steering device which can scan said rays in an X/Y raster fashion over the hole;
c. A current or particle detector which measures the amount of current that passes through said hole; and
d. A system of electronics that provides deflection voltages or current to said electro-optical steering device.

24. An apparatus according to claim 23 that includes a cathode ray tube whose X/Y deflection signals are in sympathy with the X/Y deflection signals that scan said rays and whose image brightness is modulated from a signal output of said current or particle detector.

25. An apparatus according to claim 23 that includes a computer that can provide X/Y vector information to said system of electronics and also receive signals from said current or particle detector, said computer including a software program which controls the deflection of said rays, measures information from said current or particle detector, then finally displays an image of said ion source wherein the image is a gray scale display of the abundance of current versus the X/Y position of the scanned rays.

* * * * *

UNITED STATES PATENT AND TRADEMARK OFFICE
CERTIFICATE OF CORRECTION

PATENT NO.        : 7,368,727 B2
APPLICATION NO.   : 10/966243
DATED             : May 6, 2008
INVENTOR(S)       : Ward It is certified that error appears in the above-identified patent and that said Letters Patent is hereby corrected as shown below:

On the face page, in field (56), under "Other Publications", in column 2, line 2, delete "vaccum" and insert -- vacuum --, therefor.

On page 2, under "Foreign Patent Documents", in column 1, line 4, above "JP  5209844 *12/1983" delete "JP  63 045740  2/1888".

On page 2, under "Other Publications", in column 1, line 3, delete "vaccum" and insert -- vacuum --, therefor.

On page 2, under "Other Publications", in column 2, line 9, delete "10.1088/4484/" and insert -- 10.1088/0957-4484/ --, therefor.

On page 2, under "Other Publications", in column 2, line 12, delete "vaccum" and insert -- vacuum --, therefor.

On page 2, under "Other Publications", in column 2, line 16, delete "vaccum" and insert -- vacuum --, therefor.

On page 2, under "Other Publications", in column 2, line 25, delete "micrscopy" and insert -- microscopy --, therefor.

On page 2, under "Other Publications", in column 2, line 53, delete "Preperation" and insert -- Preparation --, therefor.

On page 2, under "Other Publications", in column 2, line 59, delete "microsope" and insert -- microscope --, therefor.

On page 2, under "Other Publications", in column 2, line 62, delete "Interation" and insert -- Interaction --, therefor.

UNITED STATES PATENT AND TRADEMARK OFFICE
CERTIFICATE OF CORRECTION

PATENT NO. : 7,368,727 B2
APPLICATION NO. : 10/966243
DATED : May 6, 2008
INVENTOR(S) : Ward It is certified that error appears in the above-identified patent and that said Letters Patent is hereby corrected as shown below:

On page 3, under "Other Publications", in column 1, line 28, delete "Intruments" and insert -- Instruments --, therefor.

On page 3, under "Other Publications", in column 1, line 32, delete "Intruments" and insert -- Instruments --, therefor.

On page 3, under "Other Publications", in column 1, line 49, delete "Muclear" and insert -- Nuclear --, therefor.

On page 3, under "Other Publications", in column 2, line 14, delete "Interation" and insert -- Interaction --, therefor.

On page 3, under "Other Publications", in column 2, line 31, delete "Feasiblity" and insert -- Feasibility --, therefor.

On page 3, under "Other Publications", in column 2, line 36, delete "Imagin" and insert -- Imaging --, therefor.

In column 3, line 3, delete "DRAWING" and insert -- DRAWINGS --, therefor.

In column 11, line 5, in Claim 7, delete "crystalographic" and insert -- crystallographic --, therefor.

In column 12, line 10, in Claim 21, delete "and or" and insert -- and/or --, therefor.

Signed and Sealed this

Fourth Day of November, 2008

JON W. DUDAS
*Director of the United States Patent and Trademark Office*